(12) United States Patent
Chou et al.

(10) Patent No.: US 10,468,587 B2
(45) Date of Patent: Nov. 5, 2019

(54) SEMICONDUCTOR STRUCTURE, ELECTRODE STRUCTURE AND METHOD OF FORMING THE SAME

(71) Applicant: TAIWAN SEMICONDUCTOR MANUFACTURING COMPANY LTD., Hsinchu (TW)

(72) Inventors: Chung-Yen Chou, Hsinchu (TW); Fu-Ting Sung, Taoyuan County (TW); Yao-Wen Chang, Taipei (TW); Shih-Chang Liu, Kaohsiung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/623,928

(22) Filed: Jun. 15, 2017

(65) Prior Publication Data

US 2017/0288135 A1    Oct. 5, 2017

Related U.S. Application Data

(62) Division of application No. 14/996,950, filed on Jan. 15, 2016, now Pat. No. 9,711,713.

(51) Int. Cl.
*H01L 43/08* (2006.01)
*H01L 43/02* (2006.01)
*H01L 43/12* (2006.01)

(52) U.S. Cl.
CPC .............. *H01L 43/08* (2013.01); *H01L 43/02* (2013.01); *H01L 43/12* (2013.01)

(58) Field of Classification Search
None
See application file for complete search history.

(56) References Cited

U.S. PATENT DOCUMENTS

2005/0255709 A1* 11/2005 Lee ................... H01L 21/76801
438/780
2008/0185670 A1* 8/2008 Kajiyama .............. B82Y 10/00
257/421

(Continued)

*Primary Examiner* — Erik Kielin
(74) *Attorney, Agent, or Firm* — WPAT, P.C., Intellectual Property Attorneys; Anthony King

(57) ABSTRACT

A semiconductor structure includes an $N^{th}$ metal layer, a diffusion barrier layer over the $N^{th}$ metal layer, a first deposition of bottom electrode material over the diffusion barrier layer, a second deposition of bottom electrode material over the first deposition of bottom electrode material, a magnetic tunneling junction (MTJ) layer over the second deposition of bottom electrode material, a top electrode over the MTJ layer; and an $(N+1)^{th}$ metal layer over the top electrode; wherein the diffusion barrier layer and the first deposition of bottom electrode material are laterally in contact with a dielectric layer, the first deposition of bottom electrode material spacing the diffusion barrier layer and the second deposition of bottom electrode material apart, and N is an integer greater than or equal to 1. An associated electrode structure and method are also disclosed.

20 Claims, 21 Drawing Sheets

(56) References Cited

U.S. PATENT DOCUMENTS

| | | | | |
|---|---|---|---|---|
| 2010/0078763 A1* | 4/2010 | Hosotani | ............... | G11C 11/161 257/537 |
| 2013/0155761 A1* | 6/2013 | Aoki | ................... | G11C 11/161 365/158 |
| 2014/0284736 A1* | 9/2014 | Toko | ..................... | H01L 43/08 257/421 |
| 2015/0325622 A1* | 11/2015 | Zhang | ................... | H01L 43/12 257/421 |
| 2015/0349247 A1* | 12/2015 | Hidaka | ................ | H01L 45/144 257/4 |
| 2016/0072048 A1* | 3/2016 | Ito | ......................... | H01L 43/08 257/421 |
| 2018/0322994 A1* | 11/2018 | Rahman | ................ | H01L 43/08 |

* cited by examiner

SEMICONDUCTOR STRUCTURE, ELECTRODE STRUCTURE AND METHOD OF FORMING THE SAME

CROSS-REFERENCE TO RELATED APPLICATIONS

This application is a divisional of U.S. application Ser. No. 14/996,950, filed on Jan. 15, 2016, and claims priority thereto.

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0," One such spin electronic device is a spin torque transfer (SIT) magnetic tunneling junction (MTJ) device MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer. Pinned layer has a fixed magnetization direction. When current flows in the direction from free layer to pinned layer, electrons flow in a reverse direction, that is, from pinned layer to free layer. The electrons are polarized to the same magnetization direction of pinned layer after passing pinned layer; flowing through tunnel layer; and then into and accumulating in free layer. Eventually, the magnetization of free layer is parallel to that of pinned layer, and MTJ device will be at a low resistance state. The electron injection caused by current is referred to as a major injection.

When current flowing from pinned layer to free layer is applied, electrons flow in the direction from free layer to pinned layer. The electrons having the same polarization as the magnetization direction of pinned layer are able to flow through tunnel layer and into pinned layer. Conversely, electrons with polarization differing from the magnetization of pinned layer will be reflected (blocked) by pinned layer and will accumulate in free layer. Eventually, magnetization of free layer becomes anti-parallel to that of pinned layer, and MTJ device will be at a high resistance state. The respective electron injection caused by current is referred to as a minor injection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
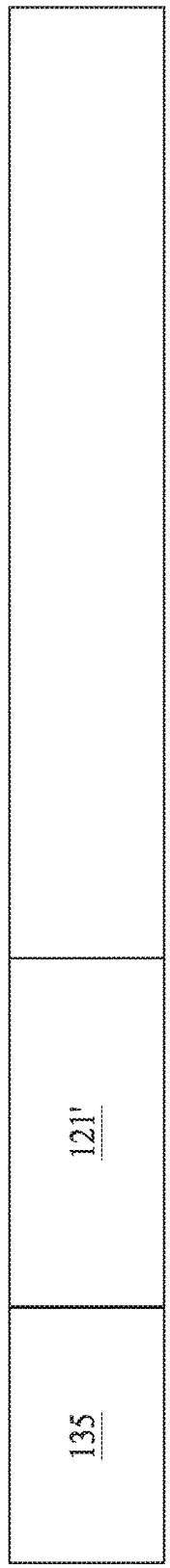
FIGS. 1-21 are cross sections of a semiconductor structure fabricated at various stages, in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about," Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embedded Magnetoresistive random-access memory (MRAM) cell in a CMOS structure has been continuously developed. A semiconductor circuit with embedded MRAM cell includes an MRAM cell region and a logic region separated from the MRAM cell region. For example, the MRAM cell region may locate at the center of the aforesaid semiconductor circuit while the logic region may locate at a periphery of the semiconductor circuit. Note the previous statement is not intended to be limiting. Other arrangement regarding the MRAM cell region and the logic region are enclosed in the contemplated scope of the present disclosure.

In the MRAM cell region, a transistor structure can be disposed under the MRAM structure. In some embodiments, the MRAM cell is embedded in the metallization layer prepared in a back-end-of-line (BEOL) operation. For example, the transistor structures in the MRAM cell region and in the logic region are disposed in a common semiconductor substrate, prepared in a front-end-of-line operation, and are substantially identical in the aforesaid two regions in some embodiments. The MRAM cell can be embedded in any position of the metallization layer, for example, between adjacent metal line layers distributed horizontally parallel to a surface of the semiconductor substrate. For instance, the embedded MRAM can be located between the $4^{th}$ metal line layer and the $5^{th}$ metal line layer in an MRAM cell region. Horizontally shifted to the logic region, the $4^{th}$ metal line layer is connected to the $5^{th}$ metal line layer though a $4^{th}$ metal via. In other words, taking the MRAM cell region and the logic region into consideration, the embedded MRAM occupies a thickness of at least a portion of the $5^{th}$ metal line layer and the $4^{th}$ metal via. The number provided for the metal line layer herein is not limiting. In general, people having ordinary skill in the art can understand that the MRAM is located between an $N^{th}$ metal line layer and an $(N+1)^{th}$ metal line layer, where N is an integer greater than or equal to 1.

The embedded MRAM includes a magnetic tunneling junction (MTJ) composed of ferromagnetic materials. A bottom electrode and a top electrode are electrically coupled to the MTJ for signal/bias conveyance. Following the example previously provided, the bottom electrode is further connected to the $N^{th}$ metal line layer, whereas the top electrode is further connected to the $(N+1)^{th}$ metal line layer.

The present disclosure provides an electrode of an MTJ. In some embodiments, the electrode is a bottom electrode. The bottom electrode is seamless and has a substantial flat surface to be in contact with a bottom surface of the MTJ. To put it another way, the interface between the MTJ and the bottom electrode is substantial flat. In additional, the top surface of the bottom electrode includes single material. When looking at a cross section of the bottom electrode, a trapezoidal shape shows at an upper portion of the bottom electrode via (BEVA), and two layers are disposed in the BEVA. A bottom layer of the two layers forms a lower portion of the BEVA, and the bottom layer does not extend to the top surface of the bottom electrode. An upper layer of the two layers fully covers the bottom layer and forms an upper portion of the BEVA. Please note that although the embodiments illustrated in the present disclosure relates to MRAM cells, but the novel BEVA structure is also applicable to other type RAM cells such as phase-change RAM (PCRAM) and conductive bridge RAM (CBRAM).

FIGS. 1 to 21 are cross sections of an MRAM cell region structure fabricated at various stages, in accordance with some embodiments of the present disclosure. In FIG. 1, a predetermined MRAM cell region 100A is provided. In some embodiments, a transistor structure is pre-formed in a semiconductor substrate (not shown in FIG. 1). The integrated circuit device may undergo further CMOS or MOS technology processing to form various features known in the art. For example, one or more contact plugs, such as silicide regions, may also be formed. The contact features may be coupled to the source and drain. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a silicide (self-aligned silicide) process.

An $N^{th}$ metal line 121' is patterned in a dielectric layer 135 over the transistor structure. In some embodiments, the $N^{th}$ metal line 121' can be formed of an electroplating operation with a Cu seed layer deposited over the patterned dielectric layer 135. In other embodiments, the $N^{th}$ metal line 121' may be formed by a variety of techniques, e.g., electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. A planarization operation is performed to expose a top surface of the $N^{th}$ metal line 121' and the top surface of the dielectric layer 135.

Figure 2:
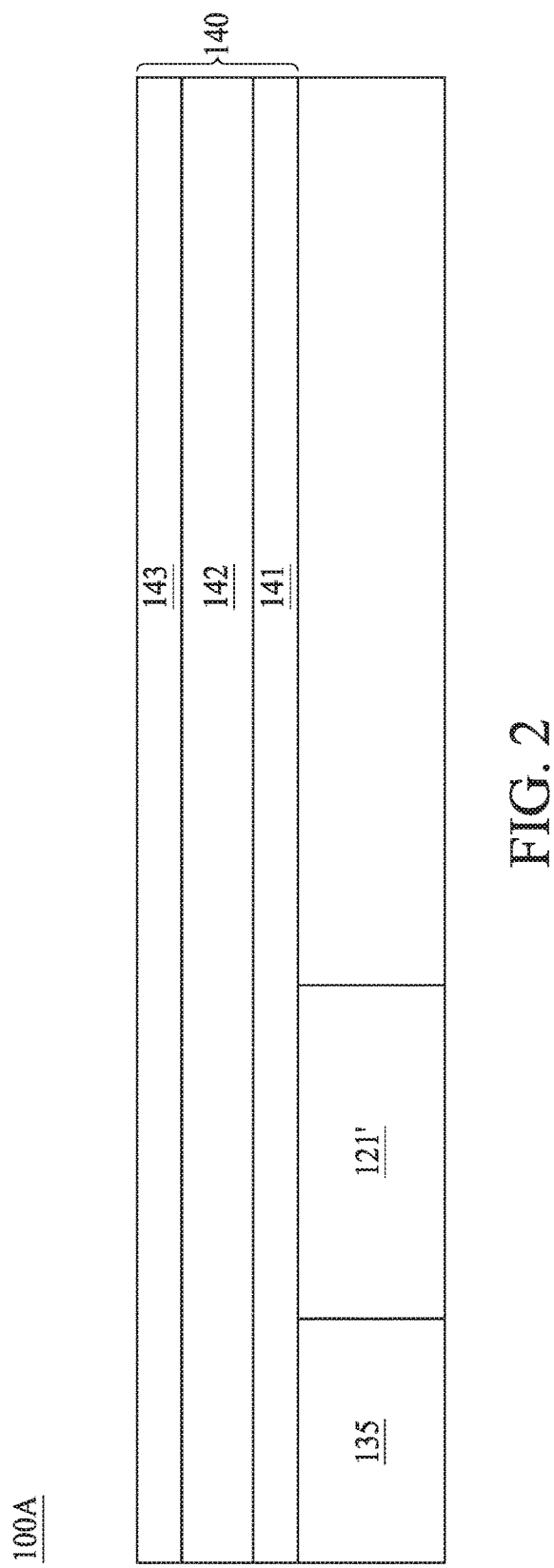

In FIG. 2, a dielectric layer 140 in a form of a stacking layer including a first silicon carbide (SiC) layer 141, a tetraethyl orthosilicate (TEOS)/silicon-rich oxide (SRO) layer 142 and a second SiC layer 143 are blanket deposited over a top surface of the $N^{th}$ metal line 121' and a top surface of the dielectric layer 135, in the MRAM cell region 100A. The dielectric layer 140 can be formed by a variety of techniques, e.g., chemical vapor deposition (CVD), low-pressure CVD (LPCVD), plasma-enhanced CVD (PECVD), sputtering and physical vapor deposition (PVD), thermal growing, and the like.

Figure 3:
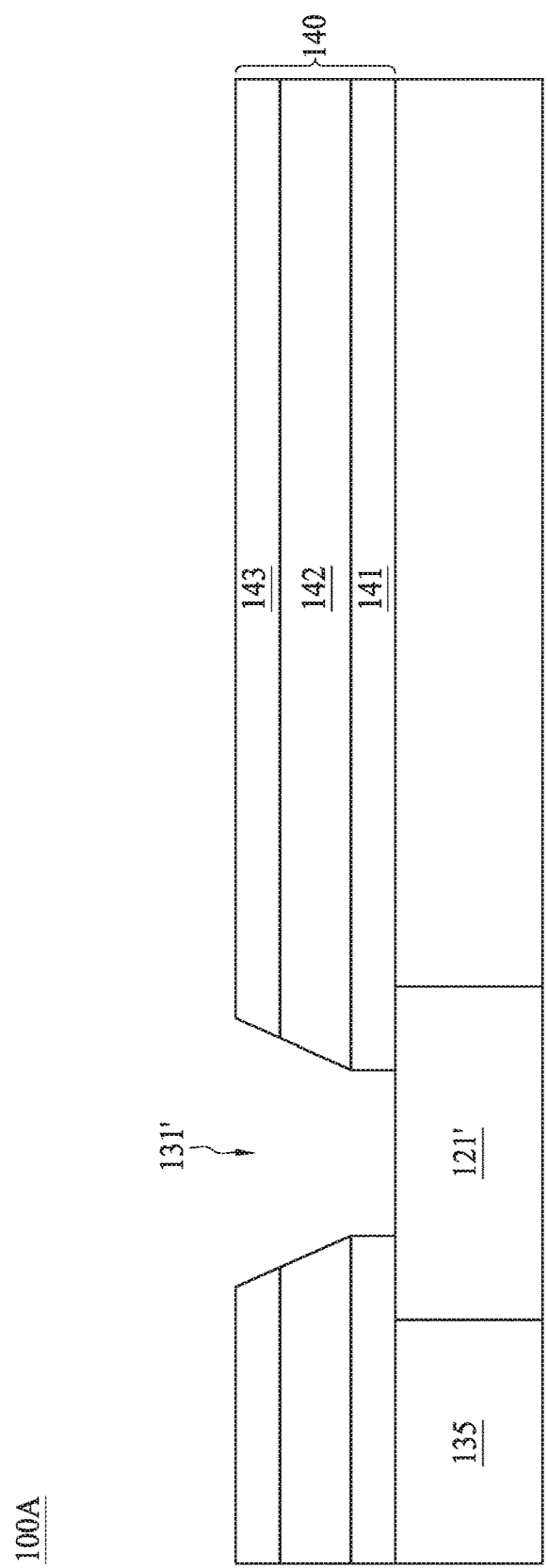

In FIG. 3, a photoresist layer (not shown) is patterned by a lithography process over the stacking layer to expose a bottom electrode region of the MTJ structure. As shown in FIG. 3, a bottom electrode via (BEVA) hole 131' is formed in the dielectric layer 140 by a suitable dry etch operation. In some embodiments, the dry etch in the present operation includes reactive ion etch (RIE) adopting fluorine-containing gases. In some embodiments, the present dry etch operation can be any suitable dielectric etch to form via trenches in a metallization structure of conventional CMOS technology. As can be seen in FIG. 3, the BEVA hole 131' has a tapered structure with a taper angle of about 40 to about 60 degrees to planar base of the dielectric layer 135. In this way, a trapezoidal shape shows at an upper portion of the BEVA hole 131'. The tapered structure helps to relax the critical dimension of the BEVA hole 131'. The tapered structure is advantageous to subsequent BEVA filling operations.

Figure 4:
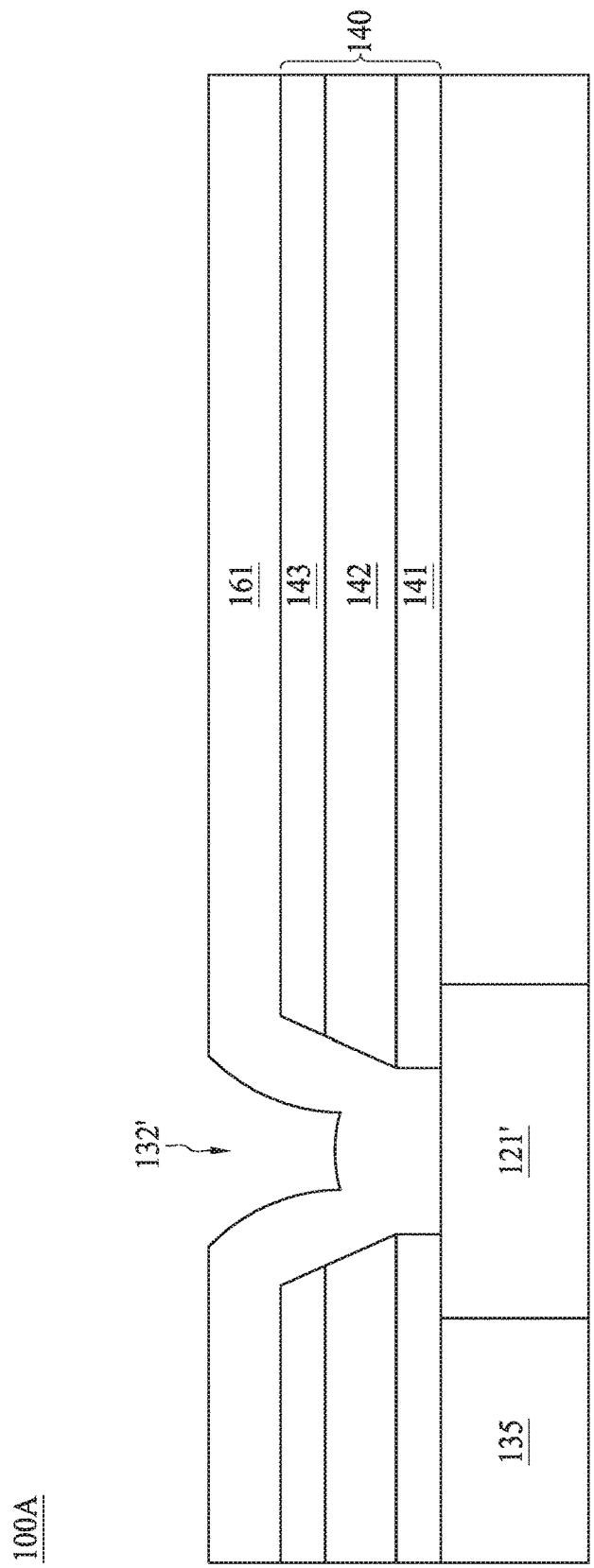

In FIG. 4, a diffusion barrier layer 161 is blanket deposited over the dielectric layer 140 and the BEVA hole 131' in the MRAM cell region 100A. In some embodiments, the diffusion barrier layer 161 can be composed of metal nitride materials, for example, tantalum nitride (TaN). In one embodiment, the formation of the diffusion barrier layer 161 includes physical vapor deposition (PVD) or other suitable technology. In some embodiments, a thickness of the diffusion barrier layer 161 is about half of the depth of the BEVA hole 131', for example, in a range of about 200 angstroms to about 500 angstroms.

Figure 5:
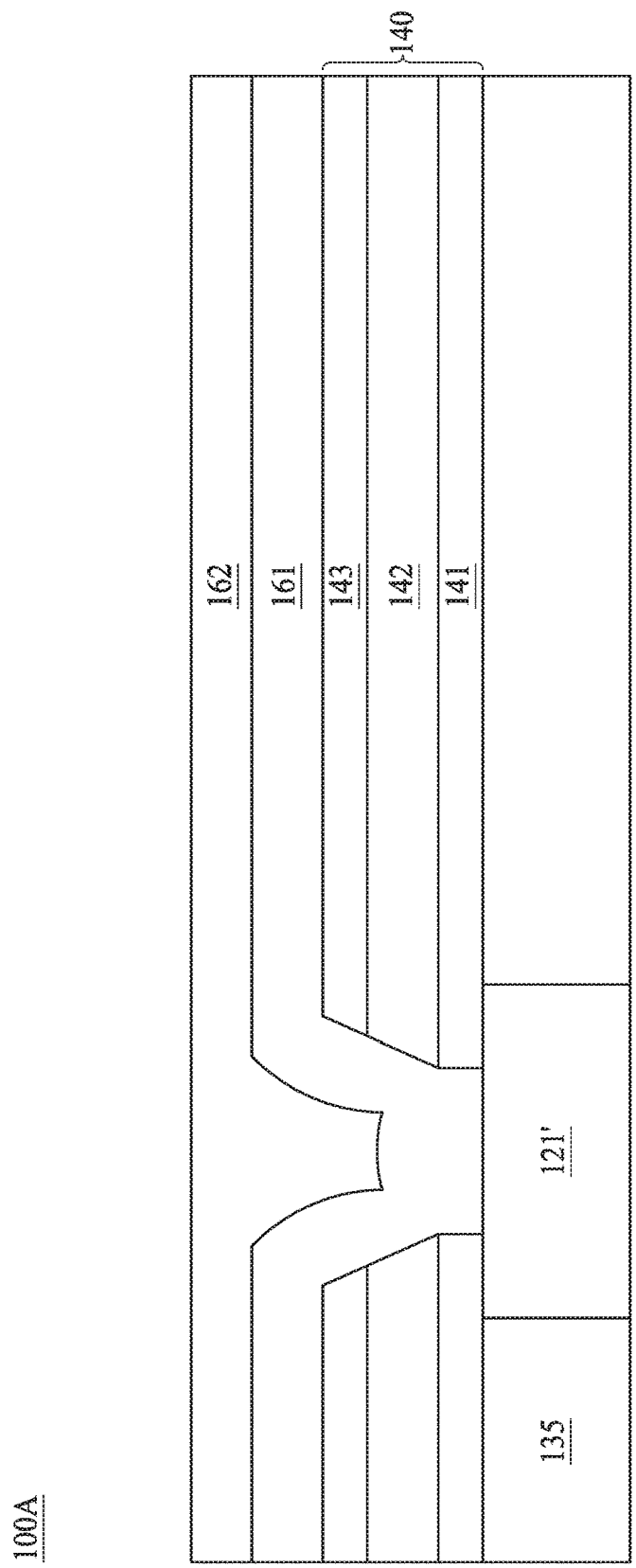

Subsequently, a material with flowability, such as a material in the form of a liquid or a gel, is supplied onto the diffusion barrier layer 161 so as to form a film 162 with flowability (hereinafter simply referred to as a flowable film) as shown in FIG. 5. The film also fills a remaining empty space 132' of the BEVA hole 131' extending into in the barrier layer 161. Then, an annealing or a bake operation is performed at about 80 degrees Celsius to about 200 degrees Celsius in order to vaporize a part or most of a solvent included in the flowable film 162 formed on the diffusion barrier layer 161. The annealing is generally designated as pre-bake, and the temperature of the pre-bake may be set so that the flowability of the flowable film 162 can be kept in a transfer process subsequently performed. Specifically, the temperature may be set in accordance with the characteristics (such as the boiling point) of the solvent used for supplying the material with flowability, and the pre-bake may be omitted in some cases.

The flowable film 162 may be, for example, a bottom antireflection coating (BARC), an organic film, an inorganic film, an organic-inorganic film (organic-inorganic hybrid film), a photo-setting resin film that is cured through irradiation with light, a photosensitive resin film such as a resist film, a porous film having a large number of pores with a diameter of approximately 1 nm through 10 nm therein, or the like.

A method for forming the flowable film 162 may be a spin coating method, a microscopic spraying method, a rotation roller method or the like, the thickness of the flowable film 162 is adjusted differently depending upon the employed method, and the film thickness can be adjusted by selecting the method for forming the flowable film 162.

Figure 6:
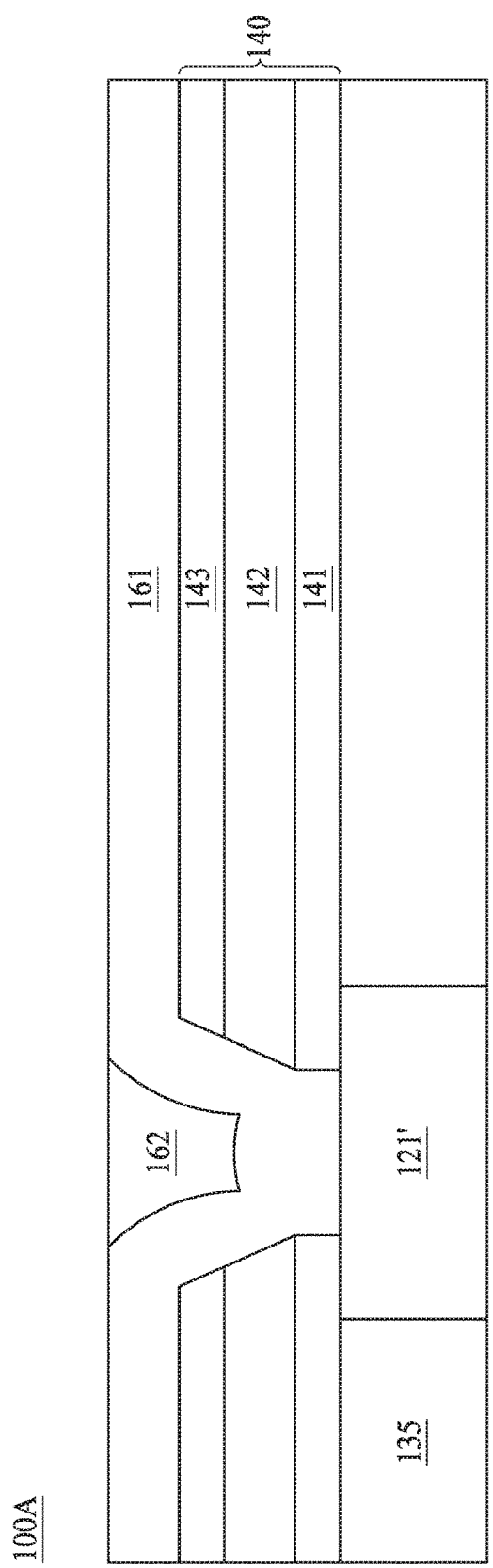

In FIG. 6, a flowable film main etch operation is performed to uniformly and horizontally etch away the flowable film 162 until the diffusion barrier layer 161 being exposed. The etching gas used in the flowable film main etch operation includes one or more fluorocarbon gases, such as $CF_4$, $C_2F_6$, $C_2F_8$, $C_3F_8$, $C_4F_{10}$, $C_4F_8$, $CHF_3$, etc., of which $CF_4$ or a $CF_4/CHF_3$ combination is more often used. The etching gas in the flowable film main etch operation may further include an inert gas, such as helium, argon, neon, xenon, and krypton, of which argon is most often used. As can be seen in FIG. 6, the flowable film main etch operation etches away all or most of the flowable film 162 on top of the diffusion barrier layer 161 except those in the remaining empty space 132' of the BEVA hole 131'. In some embodiments, the flowable film main etch operation is terminated after a predetermined time period. In some embodiments, the flowable film main etch operation is terminated by a conventional optical endpoint measurement technique. In this embodiment, the remaining flowable film 162 is intentionally left in the remaining empty space 132' and provides as a hard mask for the subsequent etch operation to remove a portion of the diffusion barrier layer 161.

Figure 7:
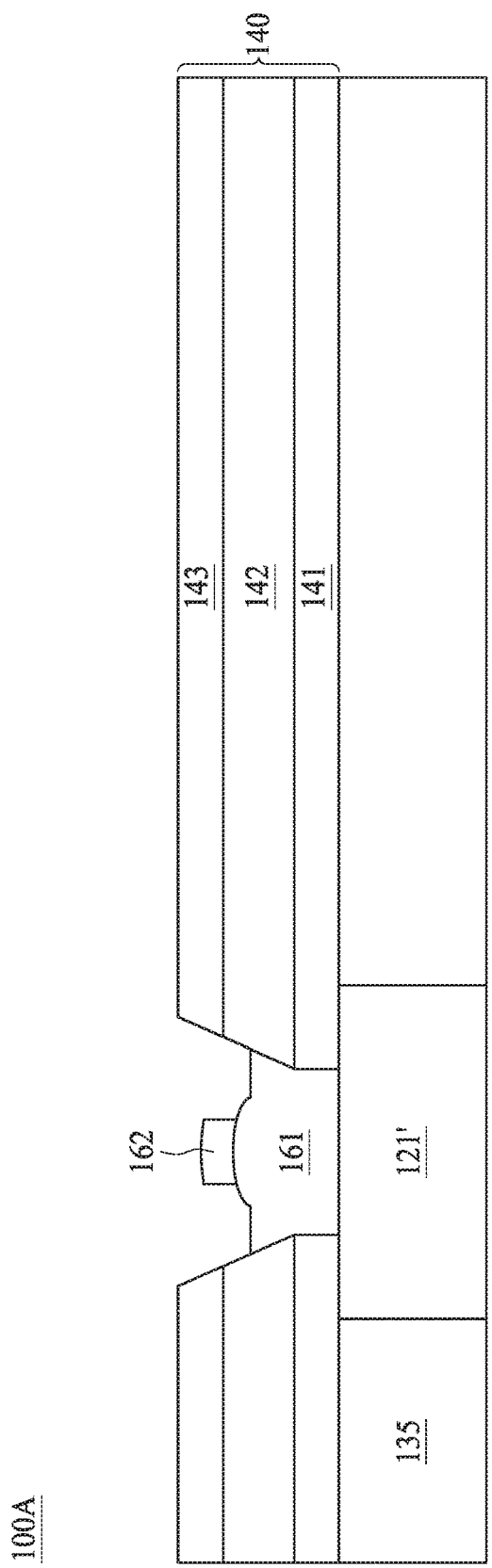

In FIG. 7, a diffusion barrier layer etch operation is used to remove a portion of the diffusion barrier layer 161 remaining in the remaining empty space 132'. In this embodiment, a selective etch operation is employed to remove the diffusion barrier layer 161 at a faster rate than the remaining flowable film 162. In some embodiment, the diffusion barrier layer 161 includes TaN, and a plasma etch operation with a high TaN etch selectivity is used. In some embodiment, other suitable etch operation with etch selectivity can be employed, for example, a dry etch operation. The etching is controlled to stop at a point where the surface of the exposed diffusion barrier layer 161 is approximately flush with the level of the bottom diffusion barrier layer 161 in the BEVA hole 131' covered by the remaining flowable film 162. In some embodiments, the diffusion barrier layer etch operation is terminated after a predetermined time period.

Depending on the materials of the diffusion barrier layer 161 and the Flowable film 162, suitable etching gases and etch conditions is used to provide adequate etch rate of the diffusion barrier layer 161 much faster than an etch rate of the flowable film 162. As can be seen in FIG. 7, when the diffusion barrier layer etch operation is complete, there is still a portion of the flowable film 162 remained.

Figure 8:
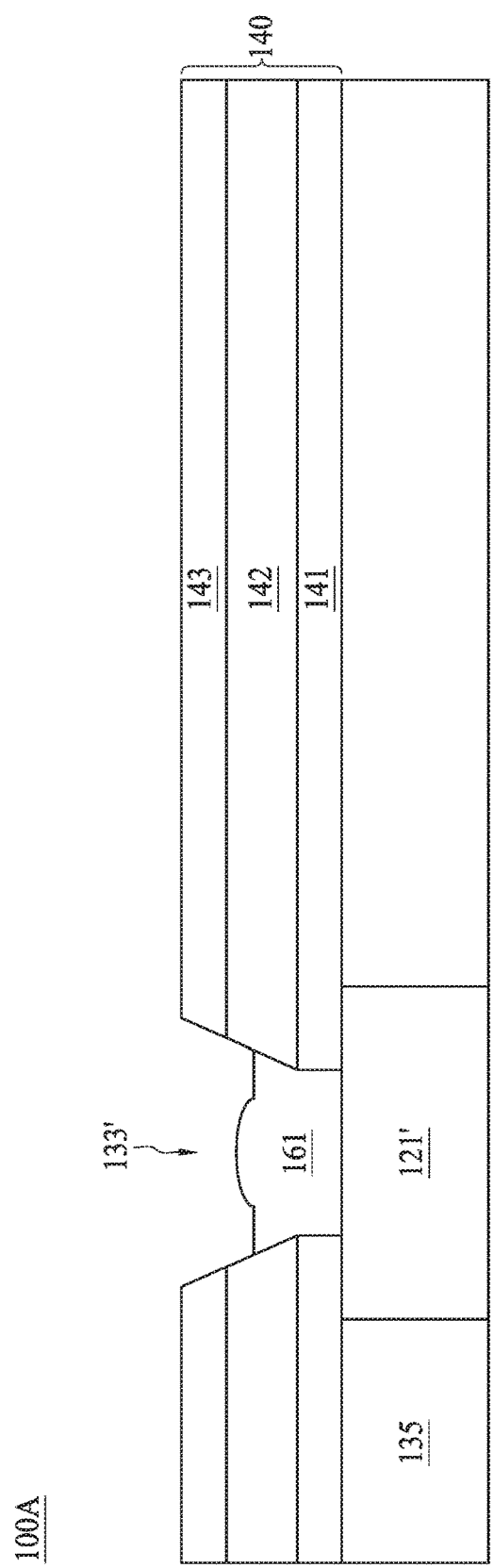

In FIG. 8, a selective etch operation is employed to remove the remained flowable film 162. In some embodiments, when the flowable film 162 includes BARC, the primary etching gas produces radicals or ions serving as a primary etchant species by plasma excitation. For example, oxygen gas ($O_2$) that produces oxygen radicals can be used as a primary etching gas in BARC etching.

Figure 9:
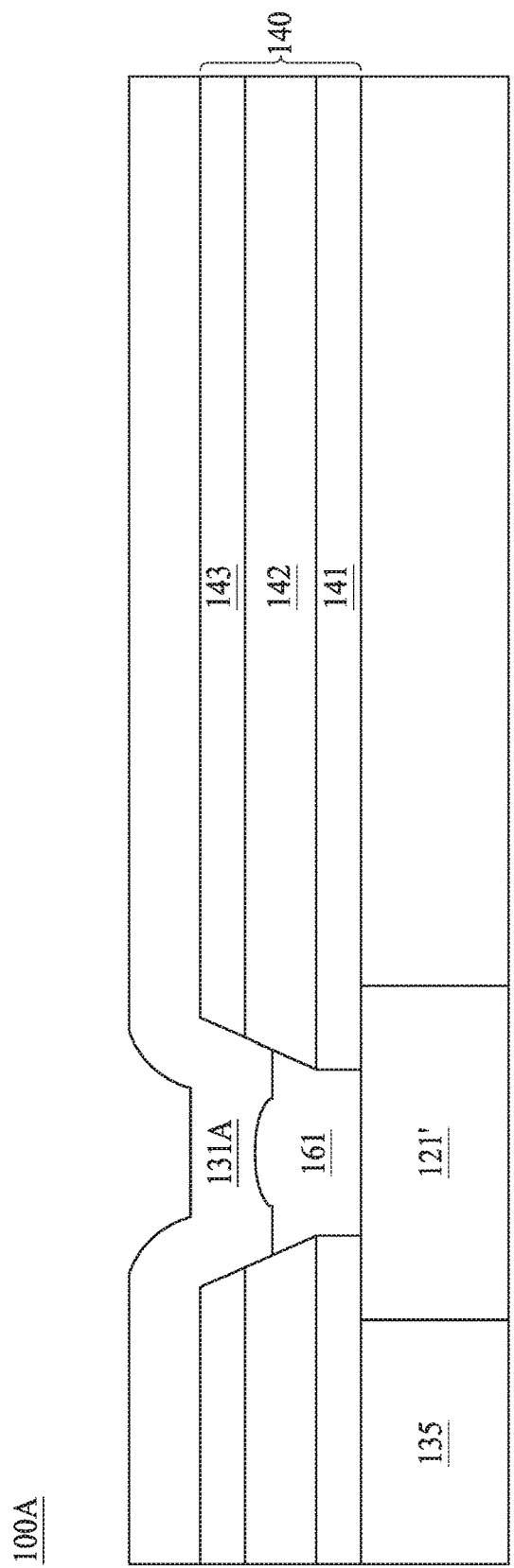

In FIG. 9, a first deposition of electrode material 131A is conducted to be blanket formed over the diffusion barrier layer 161 and the dielectric layer 140. In some embodiments, the first deposition of electrode material 131A can be used in a bottom electrode, as illustrated in FIG. 9. In other embodiments, electrodes requiring a flat surface can be obtained using the disclosed method herein. The first deposited bottom electrode material 131A may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the first deposited bottom electrode material 131A is composed of metal nitride such as titanium nitride (TiN). Because the tapered structure of the BEVA hole 131' and the presence of the diffusion barrier layer 161 in the bottom of the BEVA hole 131', a critical dimension (CD) of the remaining empty space 133' (shown in FIG. 8) of the BEVA hole 131' is relaxed. Alternatively stated, an aspect ratio of the BEVA hole 131' is reduced compared to a BEVA hole without tapered structure and without a thick diffusion barrier layer 161 disposed at the bottom thereof. The aforesaid structure is advantageous to a subsequent seamless deposition into the remaining empty space 133'.

Figure 10:
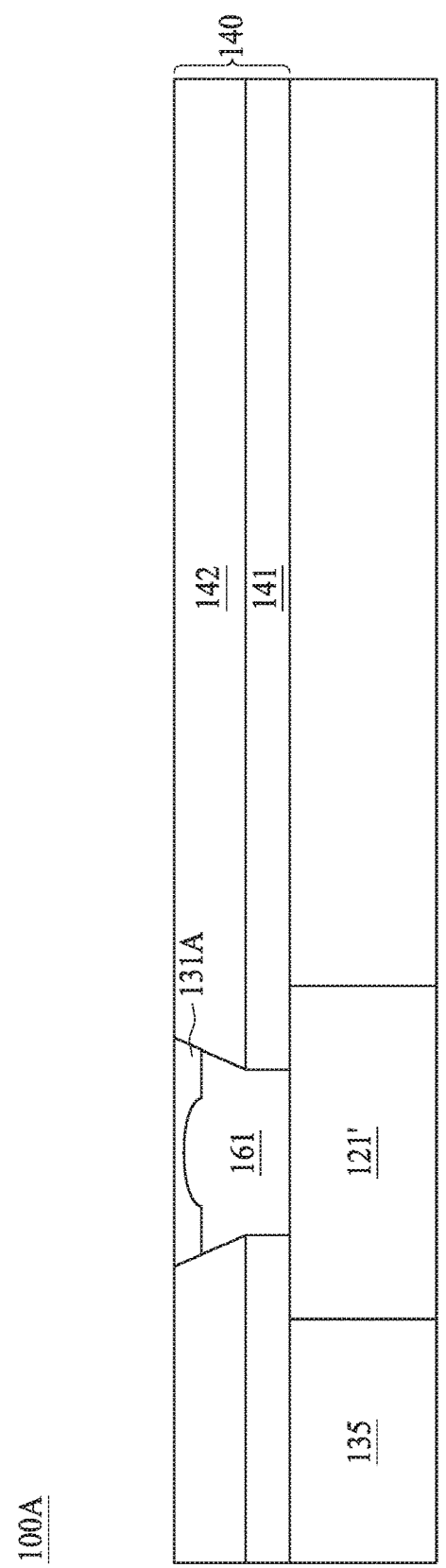

In FIG. 10, the first deposited bottom electrode material 131A is then planarized to level with a top surface of the dielectric layer 140. In this embodiment, when planarizing the first deposited bottom electrode material 131A, the second SiC layer 143 is removed as well and the top surface of the dielectric layer 140 shows the SRO layer 142, in some embodiment, a portion of the SRO layer 142 is also removed. In these embodiments, planarization operation includes a chemical mechanical polishing (CMP). In some embodiments, the CMP is terminated when the first deposited bottom electrode material 131A remains a thickness of from about 100 angstroms to about 300 angstroms. Since a top surface of the BEVA includes only the first deposited bottom electrode material 131A, no difference in polishing rate over different materials is presented in this disclosure. In a conventional BEVA where the barrier diffusion layer 161 is disposed in a form of a liner over a bottom and a sidewall of the BEVA hole 131', and the polishing rate can be different between the barrier diffusion layer 161 and the bottom electrode material. As a result, uneven top surface of the BEVA renders various problems especially in subsequent morphology-sensitive MTJ stack formation. By adopting the electrode structure disclosed herein, unevenness of the top surface induced by CMP polishing rate difference can be avoided. As shown in FIG. 10, the diffusion barrier layer 161 and the first deposition of electrode material 131A are laterally in contact with the dielectric layer 140. A top surface of the diffusion barrier layer 161 is lower than the top surface of the dielectric layer 140. In some embodiments, the first deposition of electrode material 131A and the diffusion barrier layer 161 are composed of different materials such that an interface therebetween can be observed within the BEVA hole 131', i.e., the interface being lower than the top surface of the dielectric layer 140.

Figure 11:
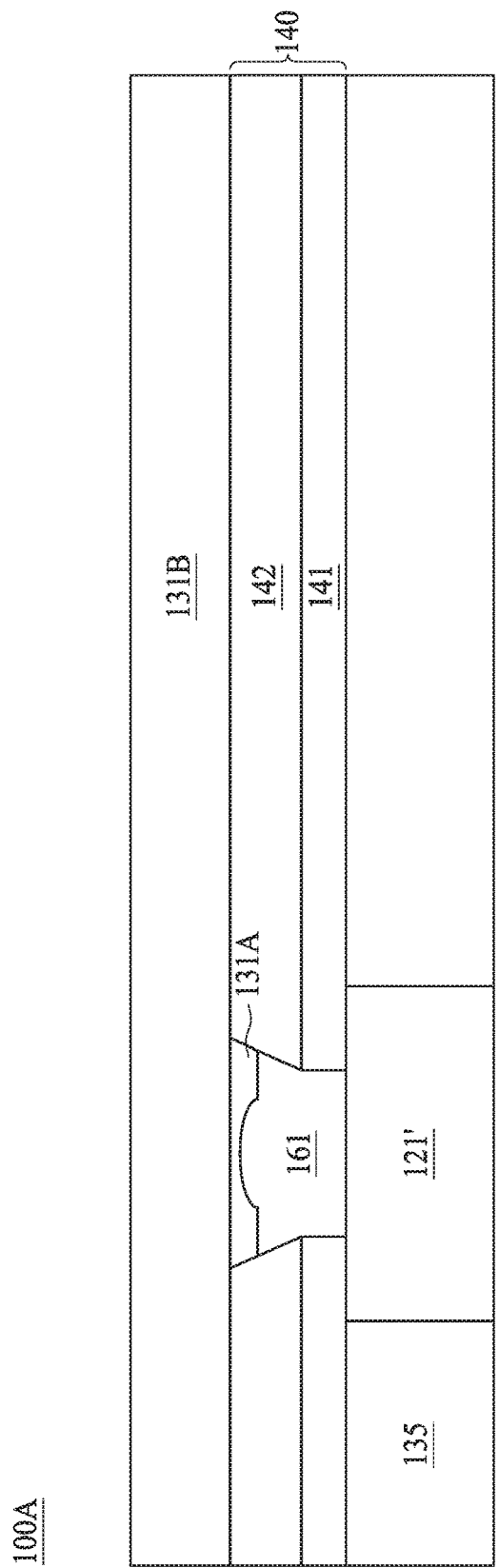
Figure 12:
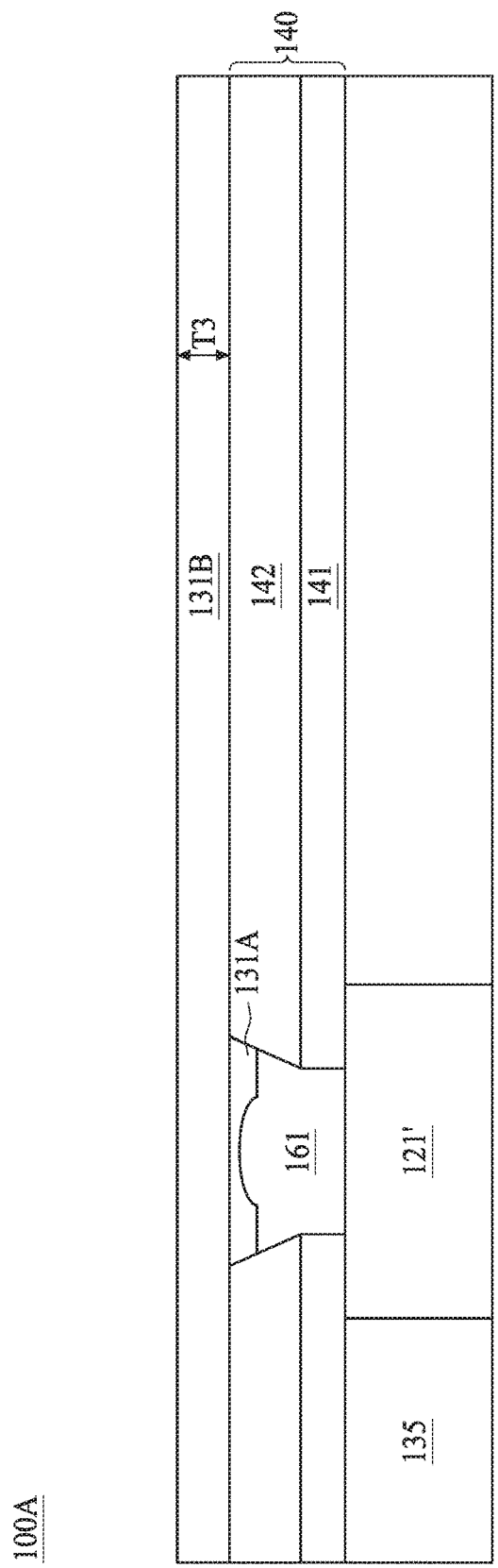

In FIG. 11, a second deposition of bottom electrode material 131B is blanket formed over the first deposited bottom electrode material 131A and the dielectric layer 140. The second deposited bottom electrode material 131B may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. The second deposited bottom electrode material 131E is then thinned to a predetermined thickness T3, as illustrated in FIG. 12. In some embodiments, etch back operation includes a CMP. In some embodiments, the second deposited bottom electrode material 131B is composed of metal nitride such as TiN.

Figure 13:
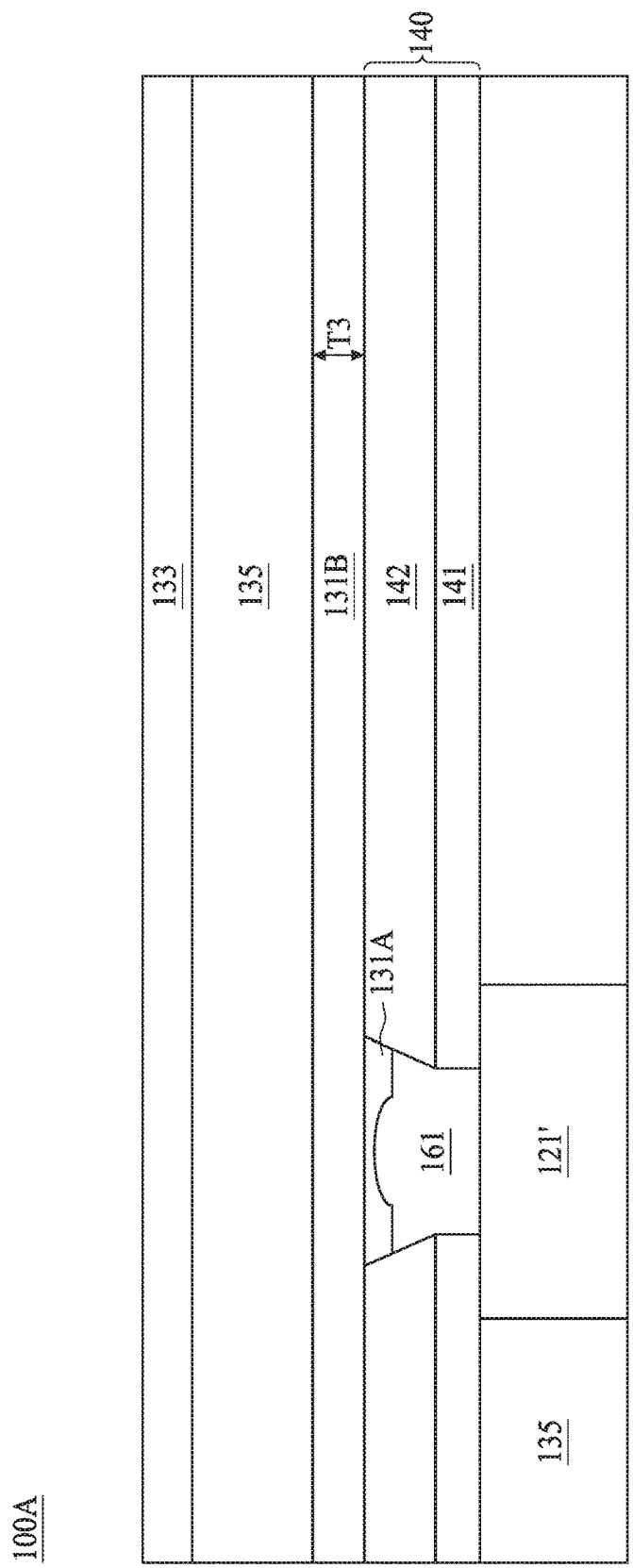

In FIG. 13, an MTJ 135 is deposited in a form of multiple material stacks over the bottom electrode 131B. In some embodiments, the MTJ 135 is having a thickness of from about 150 angstroms to about 250 angstroms. The MTJ 135 may be formed by variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the MTJ 135 may include ferromagnetic layers, spacers, and a capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The spacer may include non-ferromagnetic metal, for example, Ag, Au, Cu, Ta, W, Mn, Pt, Pd, V, Cr, Nb, Mo, Tc, Ru or the like. Another spacer may also include insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer whose magnetic polarity or magnetic orientation can be changed during write operation of its associated MRAM cell. The ferromagnetic layers and the spacer may function as a fixed or pinned layer whose magnetic orientation may not be changed during operation of its associated MRAM cell. It is contemplated that the MTJ 135 may include an antiferromagnetic layer in accordance with other embodiments. Following the formation of the MTJ 135, a top electrode layer 133 is deposited over the MTJ 135. The top electrode layer 133 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the top electrode layer 133 is composed of TiN.

Figure 14:
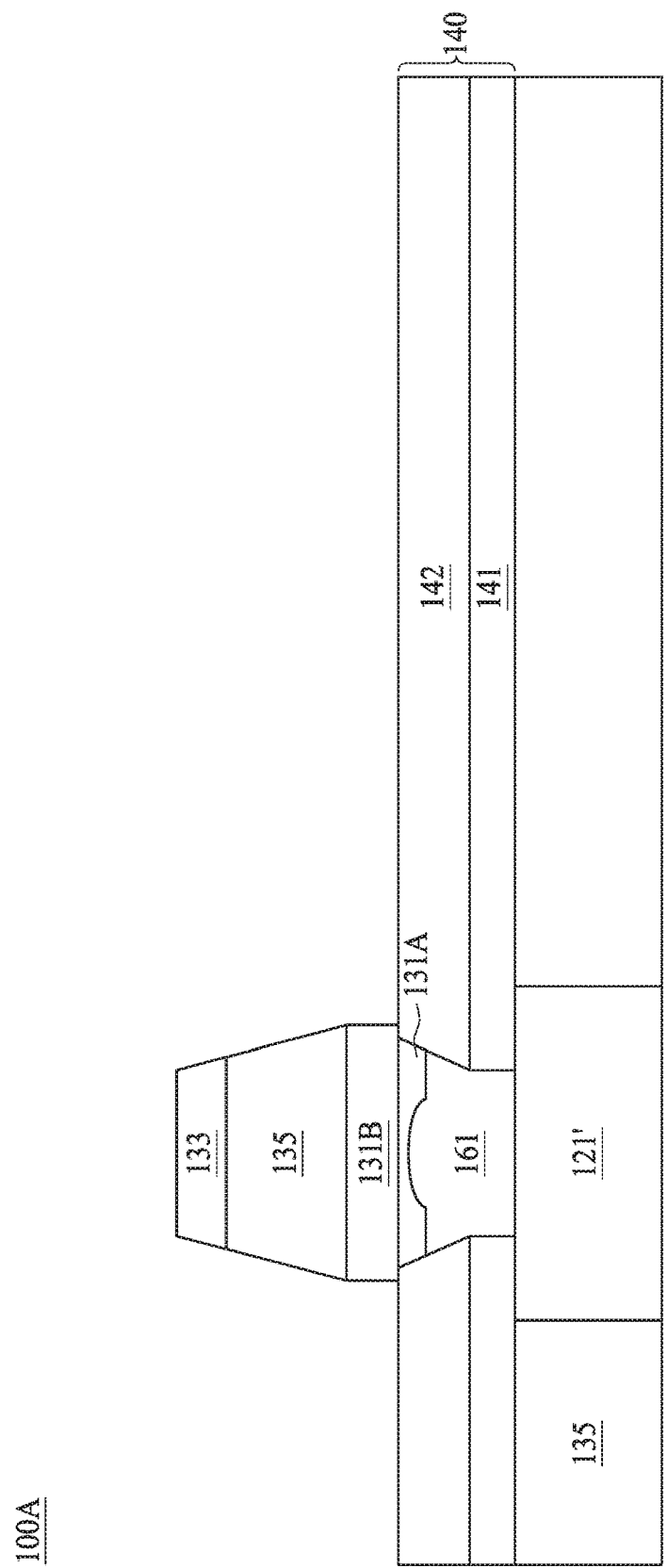

In FIG. 14, a mask layer (not shown) is formed over the top electrode 133 for the ensuing MTJ structure formation. The mask layer may have a multi-layer structure, which may include, for example, an oxide layer, an advanced patterning film (APF) layer and an oxide layer. Each of the oxide layer, the APF layer, and the oxide layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the mask layer is configured to pattern the MTJ 135, the top electrode 133, and the second deposited bottom electrode 131B. For example, a width of the masking region is determined according to the desired MTJ diameter. In some embodiments, the MTJ 135 and the top electrode 133 are formed by an RIE to have a trapezoidal shape viewing from a cross section. As shown in FIG. 14, the first deposition of electrode material 131A spaces the diffusion barrier layer 161 and the second deposition of electrode material 131B apart. In other words, the diffusion barrier layer 161 and the second deposition of electrode material 131B are not in contact of any form.

Figure 15:
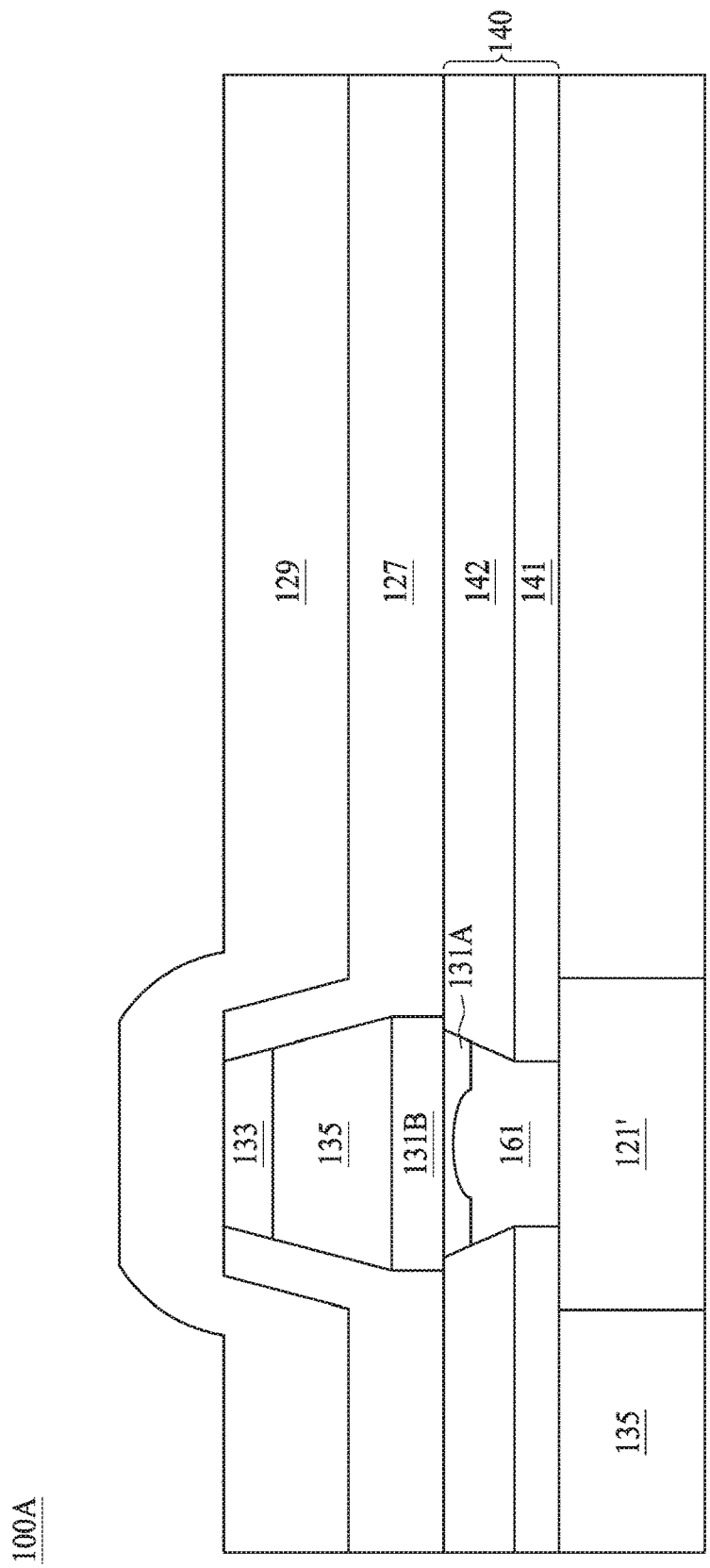
Figure 16:
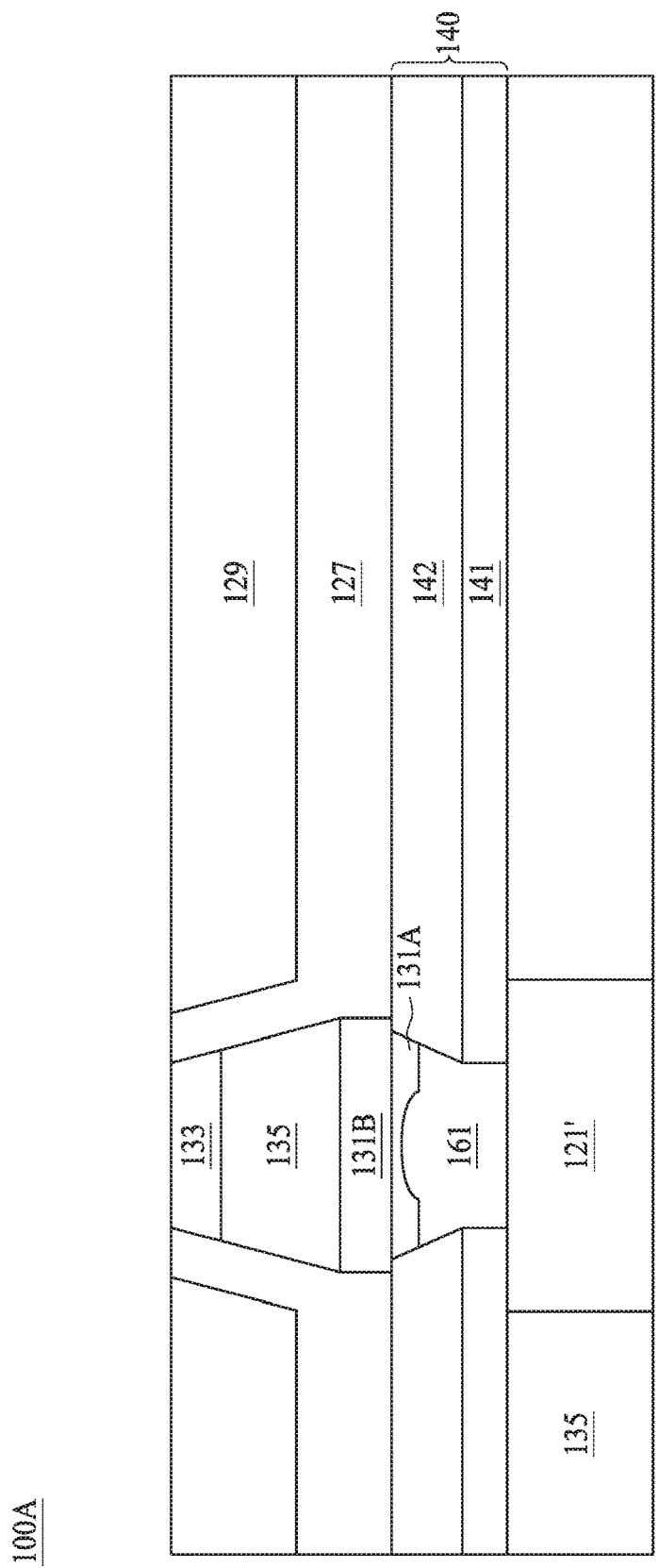

In FIG. 15, a protection layer 127 is conformally formed over the MTJ 135 and the top electrode 133. In some embodiments, the protection layer 127 possesses a thickness of from about 50 angstroms to about 300 angstroms. Note a sidewall of the MTJ 135 and the sidewall of the second deposited bottom electrode 131B are surrounded by the protection layer 127 to prevent oxidation or other contamination. Subsequently, a dielectric layer 129 such as a TEOS layer is conformally deposited over the protection layer 127. In some embodiments, a thickness of the dielectric layer 129 is to be determined according to a level of a top surface thereof relative to the top surface of the top electrode 133. In FIG. 16, a planarization operation is performed on the dielectric layer 129 such that the top surface of the dielectric layer 129 is substantially flat across the MRAM cell region 100A. As shown in FIG. 16, the top surface of the top electrode 133 is exposed from the dielectric layer 129 after the planarization operation. Note the top surface of the top electrode 133 shall be composed of TiN no matter the top electrode is a single or a composite material layer.

Figure 17:
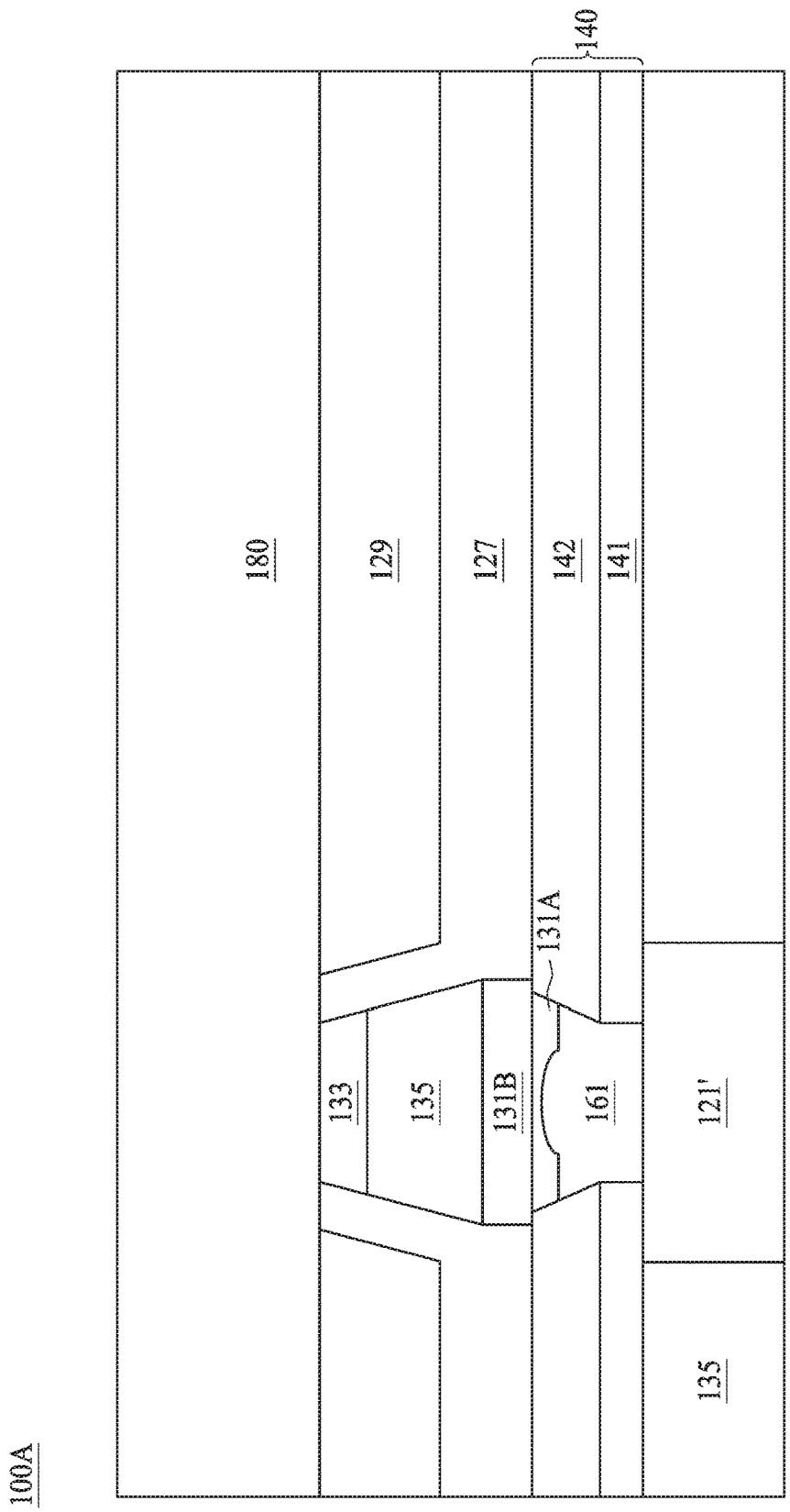
Figure 18:
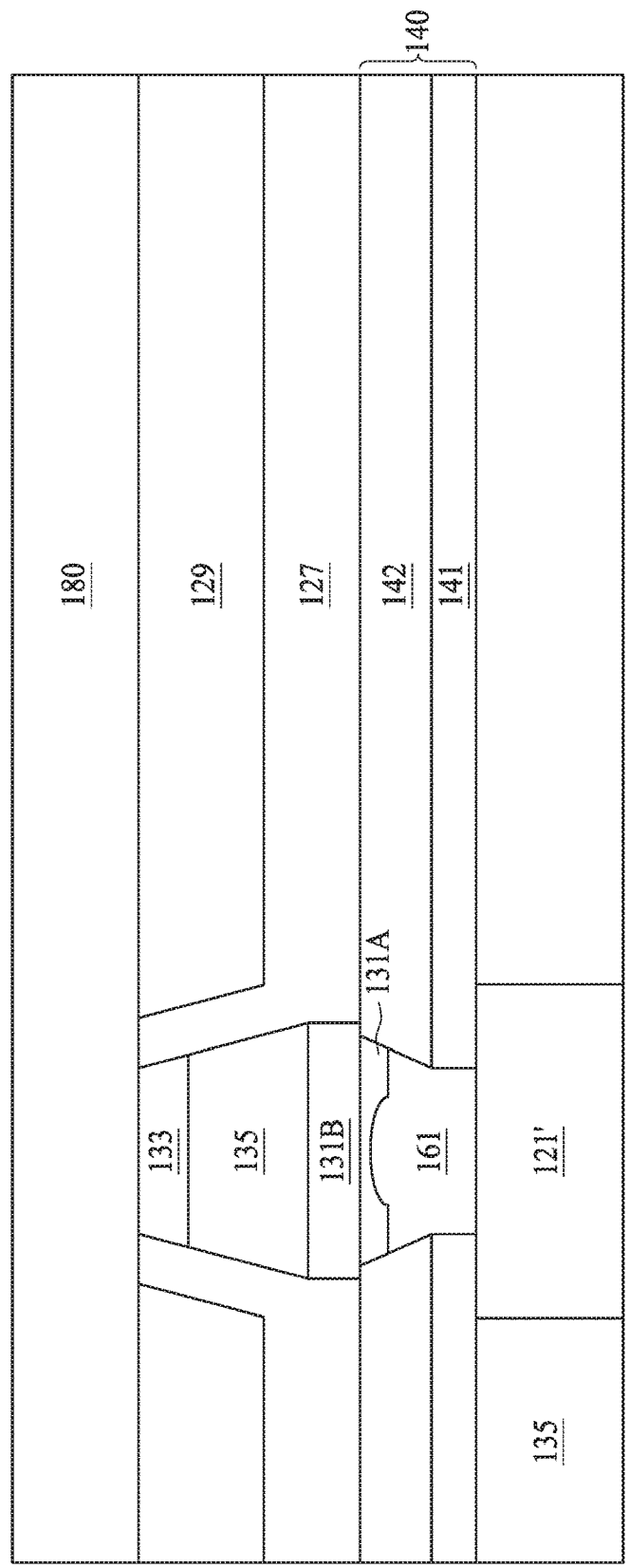
Figure 19:
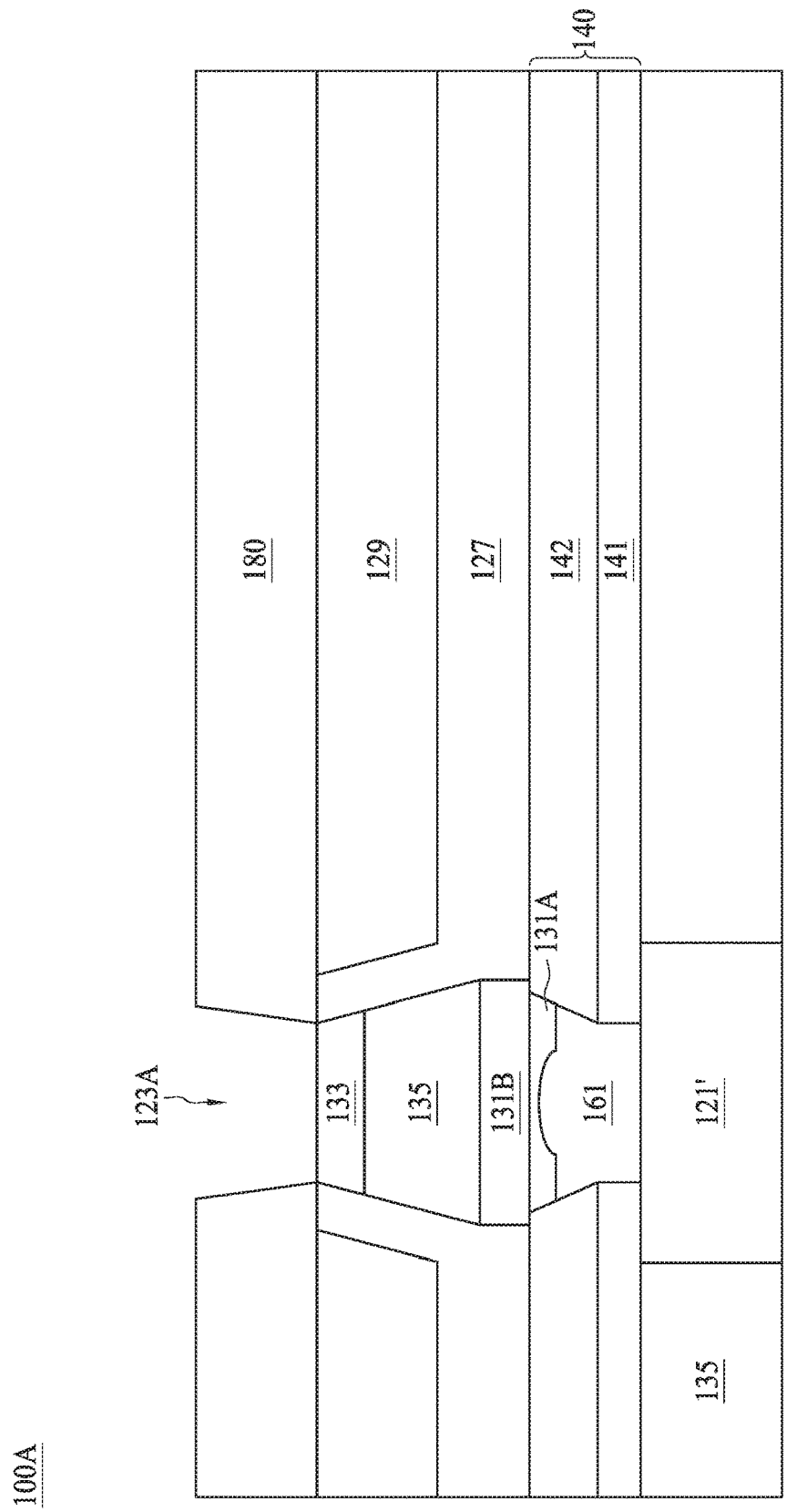

In FIG. 17, a dielectric layer-low k-dielectric layer composite 180 is formed to cover the MRAM cell region 100A. In FIG. 18, an etch back operation is performed for the following trench formation in the MRAM cell region 100A. In FIG. 19, photoresist (not shown) is patterned over the planarized dielectric surface to form trenches for metal lines and metal via. For example, in the MRAM cell region 100A, a $(N+1)^{th}$ metal line trench 123A is formed over the MTJ structure 130, exposing a top surface of the top electrode 133 of the MTJ structure 130. If the top electrode 133 is composed of a material with high oxidation rate, such as TaN, a considerable thick oxide layer can be observed on the top surface of the top electrode 133 since said top surface is exposed after the formation of the metal line trench 123A. Conventionally, an oxide bombardment operation is used to remove the oxide layer. If the top electrode 133 is composed of a material with low oxidation rate, such as TiN, very little or even no oxide layer can be observed on the top surface of the top electrode 133. In this connection, no oxide bombardment operation is required to remove such oxide layer and the sidewall/bottom integrity of the $N^{th}$ metal via trench and an $(N+1)^{th}$ metal line trench 123B can be preserved.

Figure 20:
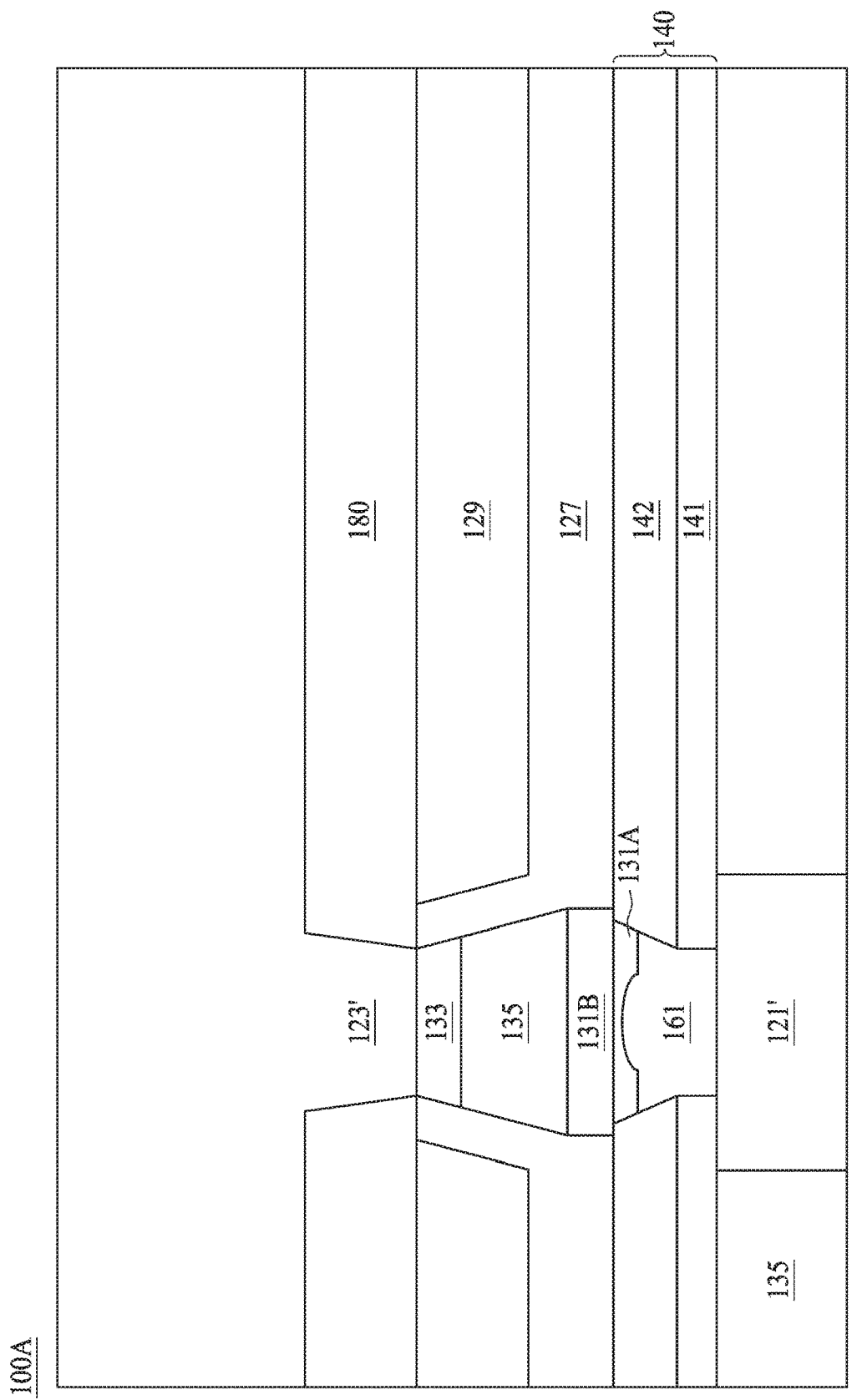
Figure 21:
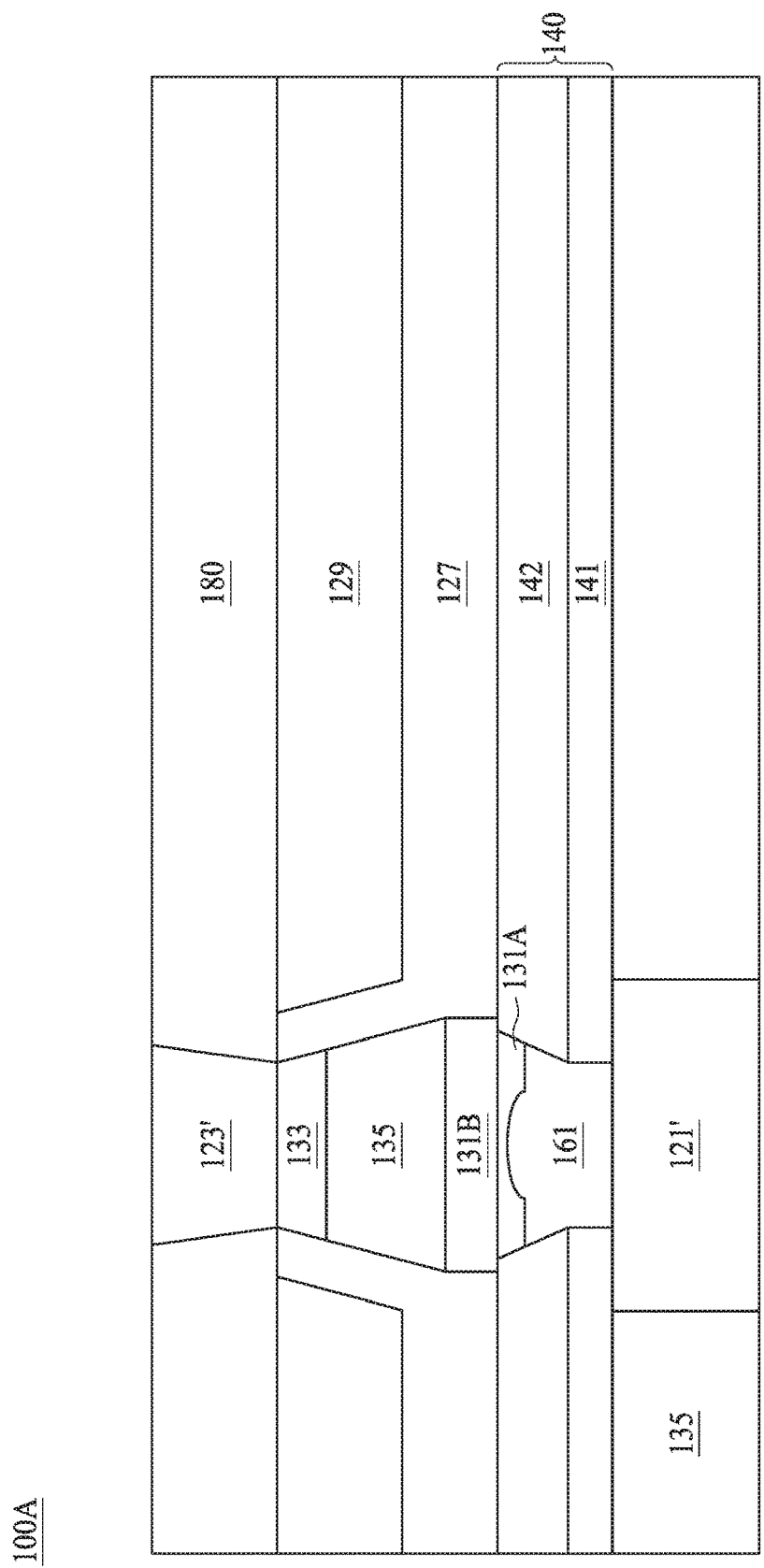

In FIG. 20 and FIG. 21, conductive metal fills the metal line trench/metal via trench (hereinafter "trenches") through, for example, a conventional Dual Damascene operation. The patterned trenches are filled with a conductive material by an electroplating operation, and excess portions of the conductive material are removed from the surface using a chemical mechanical polishing (CMP) operation, an etch operation, or combinations thereof. Details of electroplating the trenches are provided below. (N+1)$^{th}$ metal line 123' may be formed from W, and more preferably from copper (Cu), including AlCu (collectively, Cu). In one embodiment, (N+1)$^{th}$ metal lines 123' are formed using the Damascene operation, which should be familiar to those in the art. First, trenches are etched through the low k dielectric layer. This process can be performed by plasma etch operation, such as an Inductively Coupled Plasma (ICP) etch. A dielectric liner (not shown) then may be deposited on the trenches sidewalk. In embodiments, the liner materials may include silicon oxide (SiO$_x$) or silicon nitride (SiN$_x$), which may be formed by plasma deposition process, such as physical vapor deposition (PVD) or chemical vapor deposition (CVD) including plasma enhanced chemical vapor deposition (PECVD). Next, a seed layer of Cu is plated in the trenches. Note the seed layer of Cu may be plated over a top surface of the top electrode 133. Then a layer of copper is deposited in the trenches, followed by planarization of the copper layer, such as by chemical mechanical polishing (CMP), down to the top surface of a low k dielectric layer. The exposed copper surface and dielectric layer can be coplanar.

Subsequent processing may further include forming various contacts/vias/lines and multilayer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

Some embodiments of the present disclosure provide a semiconductor structure includes an N$^{th}$ metal layer; a diffusion barrier layer over the N$^{th}$ metal layer; a first deposition of electrode material over the diffusion barrier layer; a second deposition of electrode material over the first deposition of electrode material; a magnetic tunneling junction (MTJ) layer over the second deposition of electrode material; a top electrode over the MTJ layer; and an (N+1)$^{th}$ metal layer over the top electrode; wherein the diffusion barrier layer and the first deposition of electrode material are laterally in contact with a dielectric layer, the first deposition of electrode material spacing the diffusion barrier layer and the second deposition of electrode material apart, and N is an integer greater than or equal to 1.

Some embodiments of the present disclosure provide bottom electrode structure, including a diffusion barrier layer over and coupled to a metal layer; and an electrode over the diffusion barrier layer; wherein the diffusion barrier layer and the electrode are disposed in a dielectric layer, and a top surface of the diffusion barrier layer is lower than a top surface of the dielectric layer.

Some embodiments of the present disclosure provide a method for manufacturing a bottom electrode structure, including: depositing a dielectric layer over a top surface of a metal layer; forming a bottom electrode via (BEVA) hole having a tapered structure in the dielectric layer; depositing a diffusion barrier layer over the dielectric layer and into the BEVA hole; applying a flowable film over the diffusion barrier layer and performing anneal upon the flowable film; removing a portion of the flowable film and selectively etching away a portion of the diffusion barrier layer until a top surface of the diffusion barrier layer is lower than a top surface of the dielectric layer; and removing the remained flowable film and depositing an electrode over the diffusion barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrode structure, comprising:
   a diffusion barrier layer over and coupled to a metal layer; and
   an electrode over the diffusion barrier layer, a bottom surface of the electrode is uneven and a center region of the bottom surface is higher than an outer region of the bottom surface;
   wherein the diffusion barrier layer and the electrode are disposed in a dielectric layer, and a top surface of the diffusion barrier layer is lower than a top surface of the dielectric layer, and a portion of the electrode and a portion of the diffusion barrier layer form a tapered structure; and
   the top surface of the diffusion barrier layer is lower than the top surface of the dielectric layer by about 100 angstroms to about 300 angstroms.

2. The electrode structure of claim 1, wherein the electrode structure is a bottom electrode of a magnetic random access memory (MRAM) cell.

3. The electrode structure of claim 1, wherein the tapered structure tapering toward the metal layer.

4. The electrode structure of claim 1, wherein the diffusion barrier layer includes metal nitride materials.

5. The electrode structure of claim 4, wherein the diffusion barrier layer includes tantalum nitride (TaN).

6. The electrode structure of claim 1, wherein the electrode includes titanium nitride (TiN).

7. The electrode structure of claim 1, wherein the dielectric layer includes a silicon carbide (SiC) layer.

8. The electrode structure of claim 1, wherein the dielectric layer includes a silicon-rich oxide (SRO) layer.

9. An electrode structure, comprising:
   a metal layer;
   a dielectric layer over the metal layer;
   a diffusion barrier layer disposed in the dielectric layer, wherein the diffusion barrier layer is over and coupled to the metal layer; and
   a first deposition of electrode material over the diffusion barrier layer;
   a second deposition of electrode material over the first deposition of electrode material;
   wherein the diffusion barrier layer and the first deposition of electrode material are laterally in contact with the dielectric layer, the first deposition of electrode material spacing the diffusion barrier layer and the second deposition of electrode material apart;

a top surface of the diffusion barrier layer is uneven and a center region of the top surface is higher than an outer region of the top surface; and wherein the top surface of the diffusion barrier layer is lower than the top surface of the dielectric layer by about 100 angstroms to about 300 angstroms.

10. The electrode structure of claim 9, wherein the first deposition of electrode material and the second deposition of electrode material together form a bottom electrode of a magnetic random access memory (MRAM) cell.

11. The electrode structure of claim 9, wherein the first deposition of electrode material and a portion of the diffusion barrier layer form a tapered structure tapering toward the metal layer.

12. The electrode structure of claim 9, wherein the diffusion barrier layer includes metal nitride materials.

13. The electrode structure of claim 12, wherein the diffusion barrier layer includes tantalum nitride (TaN).

14. The electrode structure of claim 9, wherein the first deposition of electrode material and the second deposition of electrode material includes titanium nitride (TiN).

15. The electrode structure of claim 9, wherein the dielectric layer includes a silicon carbide (SiC) layer.

16. The electrode structure of claim 9, wherein the dielectric layer includes a silicon-rich oxide (SRO) layer.

17. An electrode structure, comprising:
a metal layer;
a dielectric layer over the metal layer;
a diffusion barrier layer over and coupled to the metal layer; and
a protection layer over the dielectric layer;
a bottom electrode over the diffusion barrier layer;
wherein a lower portion of the bottom electrode and the diffusion barrier layer are disposed in the dielectric layer and laterally in contact with the dielectric layer, and an upper portion of the bottom electrode is disposed in the protection layer and laterally in contact with the protection layer; and
a top surface of the diffusion barrier layer is uneven and a center region of the top surface is higher than an outer region of the top surface.

18. The electrode structure of claim 17, wherein the diffusion barrier layer includes tantalum nitride (TaN).

19. The electrode structure of claim 17, wherein the bottom electrode includes titanium nitride (TiN).

20. The electrode structure of claim 17, wherein the dielectric layer includes a silicon carbide (SiC) layer.

* * * * *